(12) United States Patent
Asakawa et al.

(10) Patent No.: US 11,167,469 B2
(45) Date of Patent: Nov. 9, 2021

(54) TEMPLATE, METHOD FOR MANUFACTURING TEMPLATE, AND PATTERN FORMATION METHOD

(71) Applicant: Toshiba Memory Corporation, Tokyo (JP)

(72) Inventors: Koji Asakawa, Kawasaki Kanagawa (JP); Shinobu Sugimura, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 627 days.

(21) Appl. No.: 15/915,154

(22) Filed: Mar. 8, 2018

(65) Prior Publication Data

US 2019/0077068 A1 Mar. 14, 2019

(30) Foreign Application Priority Data

Sep. 14, 2017 (JP) .............................. JP2017-176689

(51) Int. Cl.
| | |
|---|---|
| *B29C 59/02* | (2006.01) |
| *B29C 59/00* | (2006.01) |
| *B29C 33/38* | (2006.01) |
| *G03F 7/00* | (2006.01) |
| *H05K 3/00* | (2006.01) |

(Continued)

(52) U.S. Cl.
CPC ........ *B29C 59/022* (2013.01); *B29C 33/3842* (2013.01); *B29C 59/002* (2013.01); *G03F 7/0002* (2013.01); *B29K 2105/0058* (2013.01); *B29K 2105/24* (2013.01);

(Continued)

(58) Field of Classification Search
None
See application file for complete search history.

(56) References Cited

U.S. PATENT DOCUMENTS

| | | | | | |
|---|---|---|---|---|---|
| 7,604,906 | B1 * | 10/2009 | Volk | ....................... | B82Y 10/00 430/311 |
| 2006/0280962 | A1 * | 12/2006 | Hazel | ...................... | C23C 28/04 428/689 |

(Continued)

FOREIGN PATENT DOCUMENTS

| | | |
|---|---|---|
| JP | 2015-214072 A | 12/2015 |
| WO | WO 2016-152600 A | 9/2016 |
| WO | WO-2016-152600 A1 * | 9/2016 |

OTHER PUBLICATIONS

Priyanka Nayar etal.: "Structural, optical and mechanical properties of amorphous and crystalline alumina thin films", Thin Solid Films, 568 (2014) p. 19-24.*

*Primary Examiner* — Matthew J Daniels
*Assistant Examiner* — Mohammad M Ameen
(74) *Attorney, Agent, or Firm* — Finnegan, Henderson, Farabow, Garrett & Dunner L.L.P.

(57) ABSTRACT

According to one embodiment, a template includes a base body, and a first film. The base body has a first surface and a second surface. The first surface includes silicon oxide and spreads along a first plane. The second surface crosses the first plane. The first film includes aluminum oxide. A direction from the second surface toward the first film is aligned with a direction perpendicular to the second surface. A thickness of the first film along the direction perpendicular to the second surface is not less than 0.3 nm and not more than 10 μm. The first surface includes an unevenness.

11 Claims, 3 Drawing Sheets

(51) Int. Cl.
 B29L 31/34 (2006.01)
 B29K 105/00 (2006.01)
 B29K 105/24 (2006.01)

(52) U.S. Cl.
 CPC ............... B29K 2995/0069 (2013.01); B29L 2031/3425 (2013.01); H05K 3/0014 (2013.01); H05K 2203/0121 (2013.01)

(56) References Cited

U.S. PATENT DOCUMENTS

| | | | | |
|---|---|---|---|---|
| 2007/0212522 | A1* | 9/2007 | Heidari | G03F 7/0002 428/141 |
| 2011/0052925 | A1* | 3/2011 | Sarrafi-Nour | C04B 41/52 428/448 |
| 2013/0033545 | A1* | 2/2013 | Nakahashi | B41J 2/1433 347/45 |
| 2017/0038677 | A1* | 2/2017 | Sato | G03F 7/0002 |

* cited by examiner

TEMPLATE, METHOD FOR MANUFACTURING TEMPLATE, AND PATTERN FORMATION METHOD

CROSS-REFERENCE TO RELATED APPLICATIONS

This application is based upon and claims the benefit of priority from Japanese Patent Application No. 2017-176689, filed on Sep. 14, 2017; the entire contents of which are incorporated herein by reference.

FIELD

Embodiments described herein relate generally to a template, a method for manufacturing the template, and a pattern formation method.

BACKGROUND

For example, there is a pattern formation method in which an unevenness is transferred to a resin liquid by pressing the surface of a template including the unevenness onto the resin liquid. It is desirable to improve the productivity for the template and the pattern formation method.

DETAILED DESCRIPTION

According to one embodiment, a template includes a base body, and a first film. The base body has a first surface and a second surface. The first surface includes silicon oxide and spreads along a first plane. The second surface crosses the first plane. The first film includes aluminum oxide. A direction from the second surface toward the first film is aligned with a direction perpendicular to the second surface. A thickness of the first film along the direction perpendicular to the second surface is not less than 0.3 nm and not more than 10 μm. The first surface includes an unevenness.

According to another embodiment, a method for manufacturing a template is disclosed. The method can preparing a base body having a first surface and a second surface. The first surface includes silicon oxide and spreads along a first plane. The second surface crosses the first plane. The method can include forming a first film and a second film. The first film includes aluminum oxide. The second film includes at least one of a phosphonic acid or a phosphonic acid compound. The phosphonic acid includes fluoroalkyl. The phosphonic acid compound includes fluoroalkyl. The first film is positioned between the second surface and the second film.

According to another embodiment, a pattern formation method is disclosed. The method can include preparing a template. The template includes a base body, a first film, and a second film. The base body has a first surface and a second surface. The first surface includes silicon oxide, spreads along a first plane and includes an unevenness. The second surface crosses the first plane. The first film includes aluminum oxide. The second film includes at least one of a phosphonic acid or a phosphonic acid compound. The phosphonic acid includes fluoroalkyl. The phosphonic acid compound includes fluoroalkyl. The first film is positioned between the second film and the second surface. The method can include causing a resin liquid to contact the unevenness, and causing the resin liquid to solidify by irradiating a first electromagnetic wave on the resin liquid via the base body.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1A:
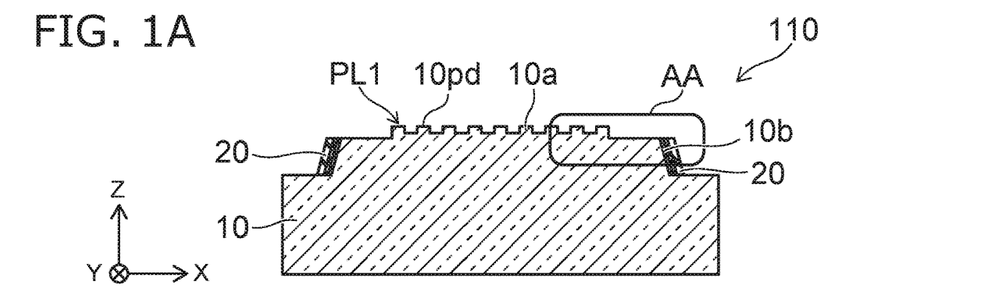
FIG. 1A and FIG. 1B are schematic cross-sectional views illustrating a template according to a first embodiment.
Figure 1B:
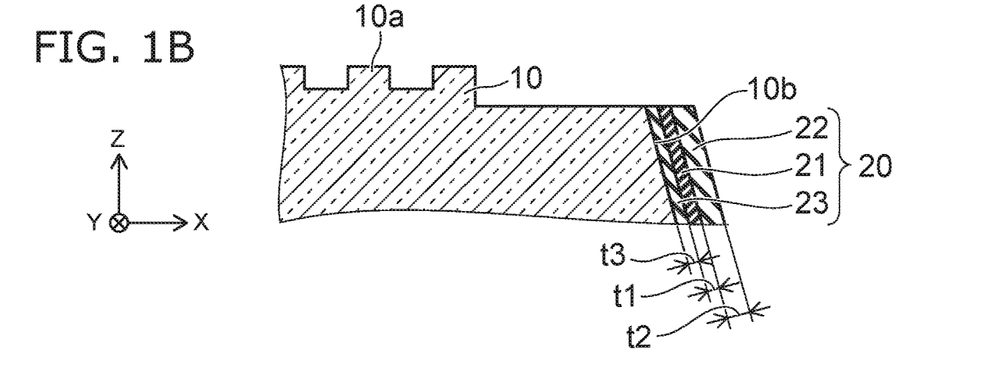

FIG. 1A and FIG. 1B are schematic cross-sectional views illustrating a template according to a first embodiment.

FIG. 1B is an enlarged view of portion AA of FIG. 1A.

As shown in FIG. 1A, the template 110 according to the embodiment includes a base body 10 and a stacked film 20. The template 110 includes, for example, nanoimprint lithography (NIL), etc.

The base body 10 has a first surface 10a and a second surface 10b. The first surface 10a includes silicon oxide. The first surface 10a is, for example, a quartz surface. The first surface 10a is, for example, a fused silica surface. For example, the material of the base body 10 may be quartz or fused silica.

The first surface 10a spreads along a first plane PL1. The first surface 10a includes an unevenness 10pd. As described below, the unevenness 10pd is transferred onto a resin liquid, etc. The first surface 10a is a transfer surface. For example, the unevenness 10pd of the first surface 10a corresponds to a circuit pattern to be formed.

The first plane PL1 is taken as the X-Y plane. A direction perpendicular to the X-Y plane is taken as a Z-axis direction.

The second surface 10b crosses the first plane PL1 (the X-Y plane). The second surface 10b may be tilted with respect to the first surface 10a. The second surface 10b is, for example, a "mesa surface." The second surface 10b is provided along the outer edge of the transfer surface (the first surface 10a).

The stacked film 20 is provided on the second surface 10b.

As shown in FIG. 1B, the stacked film 20 includes an intermediate film 23 and a first film 21. A second film 22 is further provided in the example.

The intermediate film 23 includes silicon. At least a portion of the intermediate film 23 may include, for example, crystalline silicon. At least a portion of the intermediate film 23 may include, for example, polycrystalline silicon. At least a portion of the intermediate film 23 may include, for example, microcrystalline silicon. A portion of the intermediate film 23 may include, for example, amorphous silicon.

The first film 21 includes aluminum oxide. The first film 21 includes AlO$_x$ (x being arbitrary). The first film 21 may include, for example, Al$_2$O$_3$.

The intermediate film 23 is provided between the second surface 10b and the first film 21.

The first film 21 is positioned between the second film 22 and the second surface 10b. For example, the first film 21 is positioned between the second film 22 and the intermediate film 23. For example, the intermediate film 23 (e.g., the silicon film) is provided on the second surface 10b. The first film 21 (the aluminum oxide film) is provided on the intermediate film 23. The second film 22 is provided on the first film 21.

The second film 22 includes at least one of a phosphonic acid including fluoroalkyl, or a phosphonic acid compound including fluoroalkyl.

For example, in the second film 22, a group based on phosphonic acid is adhered to the first film 21. For example, the group based on phosphonic acid easily bonds to the aluminum included in the first film 21. Thereby, the second film 22 is adhered to the first film 21 relatively securely.

On the other hand, fluoroalkyl exists at the surface of the second film 22. The surface of the second film 22 is liquid-repellent (water-repellent). On the other hand, as described above, the first surface 10a of the base body 10 includes silicon oxide. The surface energy of the surface of the second film 22 is smaller than the surface energy of the first surface 10a. The contact angle of the second film 22 for water is larger than the contact angle of the first surface 10a for water.

Thus, compared to the transfer surface (the first surface 10a), the liquid repellency is set to be high at the outer edge (the second surface 10b) of the transfer surface. Thereby, as described below, the transfer liquid (the resin liquid) does not adhere easily to the second surface 10b. Thereby, a template can be provided for which it is possible to improve the productivity.

In the embodiment, a thickness t3 (the thickness along a direction perpendicular to the second surface 10b) of the intermediate film 23 is, for example, not less than 10 nm and not more than 100 nm.

A thickness t1 (the thickness along the direction perpendicular to the second surface 10b) of the first film 21 is, for example, not less than 0.3 nm and not more than 10 μm.

The second film 22 is, for example, a monolayer. A thickness t2 (the thickness along the direction perpendicular to the second surface 10b) of the second film 22 is, for example, not less than 0.1 nm and not more than 10 nm.

An example of a pattern formation method using the template 110 will now be described as a second embodiment.

Second Embodiment

Figure 2A:
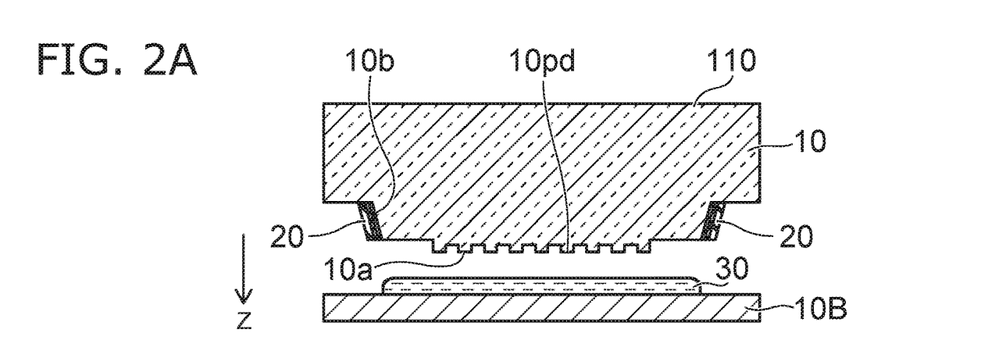
FIG. 2A and FIG. 2B are schematic cross-sectional views illustrating a pattern formation method according to a second embodiment.
Figure 2B:
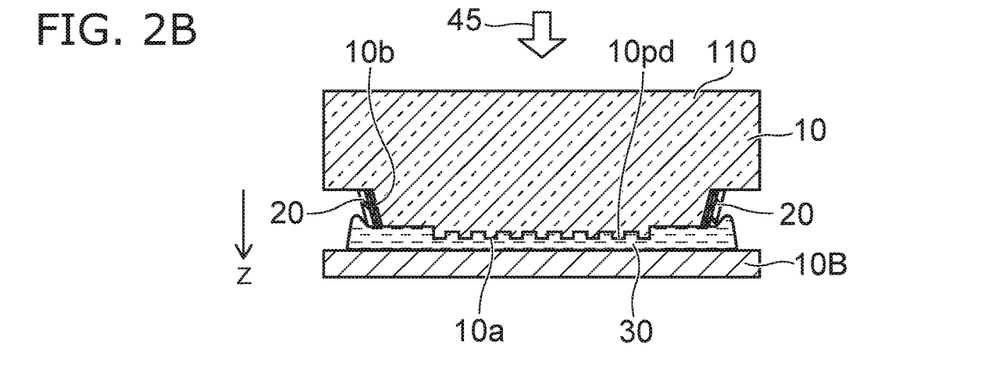

FIG. 2A and FIG. 2B are schematic cross-sectional views illustrating a pattern formation method according to a second embodiment.

A patterning substrate 10B is prepared as shown in FIG. 2A. A resin liquid 30 is coated onto the patterning substrate 10B. For example, the coating is performed by spin coating, inkjet, dipping, etc. The method of the coating is arbitrary. The patterning substrate 10B and the first surface 10a of the template 110 are caused to oppose each other. The resin liquid 30 is positioned between the patterning substrate 10B and the first surface 10a.

As shown in FIG. 2B, the resin liquid 30 is caused to contact the unevenness 10pd of the first surface 10a; and, for example, a first electromagnetic wave 45 (e.g., light) is irradiated on the resin liquid 30 via the base body 10. The resin liquid 30 is caused to solidify by the irradiation. The solidification may be performed by heat. The resin liquid 30 becomes a resin layer by solidifying. The configuration of the unevenness 10pd is transferred onto the surface of the resin layer. The resin layer and the template 110 are separated.

Thus, in the pattern formation method according to the embodiment, the template 110 is prepared. The template 110 includes the base body 10, the first film 21, and the second film 22. As described in reference to FIG. 1A, the base body 10 has the first surface 10a and the second surface 10b. The first surface 10a includes silicon oxide and includes the unevenness 10pd spreading along the first plane PL1. The second surface 10b crosses the first plane PL1. The first film 21 includes aluminum oxide. The second film 22 includes at least one of a phosphonic acid including fluoroalkyl, or a phosphonic acid compound including fluoroalkyl. The first film 21 is positioned between the second film 22 and the second surface 10b (referring to FIG. 1B).

In the pattern formation method according to the embodiment, the resin liquid 30 is caused to contact the unevenness 10pd; and the resin liquid 30 is caused to solidify by irradiating the first electromagnetic wave 45 onto the resin liquid 30 via the base body 10.

When the resin liquid 30 is caused to contact the unevenness 10pd, the first surface 10a is wetted easily by the resin liquid 30. On the other hand, the second film 22 is provided on the second surface 10b positioned at the outer edge of the first surface 10a. The second surface 10b is not easily wetted by the resin liquid 30. Thereby, the adhesion of the resin liquid 30 to the portion of the second surface 10b is suppressed.

In a reference example in which the second film 22 is not provided, the resin liquid 30 adheres easily to the portion of the second surface 10b. The adhered resin liquid 30 is solidified by the irradiation of the first electromagnetic wave 45. There are cases where a portion of the solidified resin liquid 30 (the resin layer) scatters; and a defect occurs. The yield may decrease due to the defect.

By providing the second film 22 in the embodiment, the bonding of the resin liquid 30 to portions other than the first surface 10a can be suppressed. The defects are suppressed. Thereby, high productivity is obtained.

The second film 22 is formed of a molecule including both phosphonic acid and a fluorine atom. The molecule may include, for example, a phosphonic acid including fluoroalkyl, fluorophenyl, etc. Phosphonic acid can adhere to aluminum oxide. On the other hand, it was found that phosphonic acid does not adhere easily to silicon oxide. Thereby, it was found that phosphonic acid selectively adheres to aluminum oxide. By using a material including phosphonic acid, a film of the material can be formed at the desired location.

In phosphonic acid including fluoroalkyl, the phosphonic acid is provided at one end; and the fluoroalkyl is provided at the other end. Therefore, a substantially monolayer film can be formed on the foundation in a controlled state.

By using the phosphonic acid including fluoroalkyl, the surface energy of the second film 22 can be reduced effectively. Thereby, the resin liquid 30 can effectively repel.

In the embodiment, for example, the first film 21 that includes aluminum oxide is provided as the foundation of the second film 22. The second film 22 and the first film 21 can be bonded more stably by the bond between the phosphoric acid based on the phosphonic acid and the oxygen of the aluminum. The second film 22 can be maintained stably.

In the pattern formation at this time, the first electromagnetic wave 45 is irradiated as recited above. There is a possibility that at least a portion of the bond may be damaged by the wavelength of the first electromagnetic wave 45.

In the embodiment, it is favorable to provide the intermediate film 23 including silicon. The silicon can effectively absorb light of a wavelength in the range of 150 nm to 350 nm. The intermediate film 23 functions as an attenuation film (e.g., a blocking film) of the first electromagnetic wave 45. In particular, ultraviolet light having a wavelength of 300 nm or less can be attenuated (e.g., blocked) efficiently. As described above, the first electromagnetic wave 45 is irradiated via the base body 10; therefore, the first electromagnetic wave 45 reaches the first film 21 and the second film 22 after passing through the intermediate film 23. The first electromagnetic wave that is used to solidify the resin liquid 30 is, for example, light of a wavelength of 350 nm or more. For example, the i-line (365 nm), the h-line (405 nm), the g-line (436 nm), or the like of a mercury lamp is used as the light. On the other hand, an electromagnetic wave of a wavelength of 300 nm or less undesirably damages the bonds of organic molecules. Therefore, it is favorable to attenuate electromagnetic waves of wavelengths of 300 nm or less. The component of the first electromagnetic wave 45 having a wavelength of 300 nm or less is effectively attenuated by the intermediate film 23. Therefore, the component of the first electromagnetic wave 45 having a wavelength of 300 nm or less substantially does not reach the first film 21 and the second film 22. Thus, the damage of the bonds can be suppressed by the intermediate film 23. Thereby, the second film 22 is more stable.

For example, the thickness t3 of the intermediate film 23 is 10 nm or more. Thereby, the component of the first electromagnetic wave 45 having a wavelength of 300 nm or less can be attenuated. In the case where the thickness t3 is thick, the first electromagnetic wave 45 can be attenuated more effectively. In the case where the thickness t3 is excessively thick, for example, the first electromagnetic wave is not easily transmitted because the resin liquid 30 cures. It is favorable for the thickness t3 to be 100 nm or less.

The peak wavelength of the first electromagnetic wave 45 is, for example, 185 nm, 254 nm, 365 nm, 405 nm, 436 nm, etc. The resin liquid 30 can be caused to solidify efficiently by such a peak wavelength. For such wavelengths of the first electromagnetic wave 45, the component that is 300 nm or less can be attenuated more effectively by the intermediate film 23.

For example, the transmittance of the intermediate film 23 is 0.02% or less for the first electromagnetic wave 45 in a range of wavelengths not less than 240 nm and not more than 300 nm. For example, the transmittance of the intermediate film 23 is 1% or less for an electromagnetic wave of a wavelength of 300 nm or less.

Third Embodiment

An example of a method for manufacturing a template will now be described as a third embodiment.

FIG. 3A to FIG. 3F are schematic cross-sectional views illustrating the method for manufacturing the template according to the third embodiment.

Figure 3A:
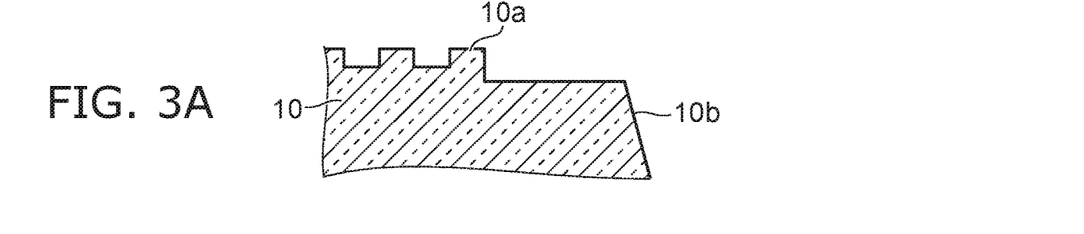
FIG. 3A to FIG. 3F are schematic cross-sectional views illustrating the method for manufacturing the template according to the third embodiment.

The base body 10 is prepared as shown in FIG. 3A. The base body 10 has the first surface 10a and the second surface 10b.

Figure 3B:
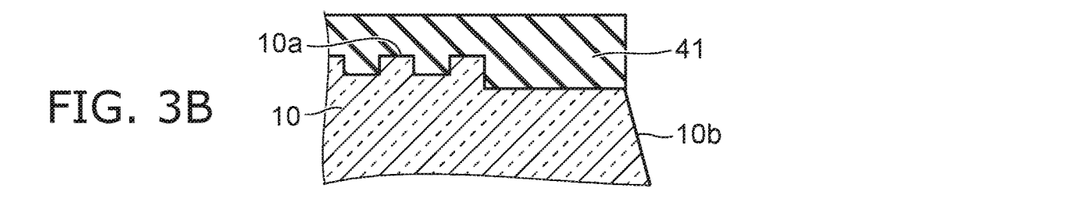

As shown in FIG. 3B, for example, a mask 41 is formed on the first surface 10a. For example, the mask 41 is not formed on the second surface 10b. For example, a chromium film or a mask used when forming the second surface 10b is utilized as the mask 41.

Figures 3C, 3D:
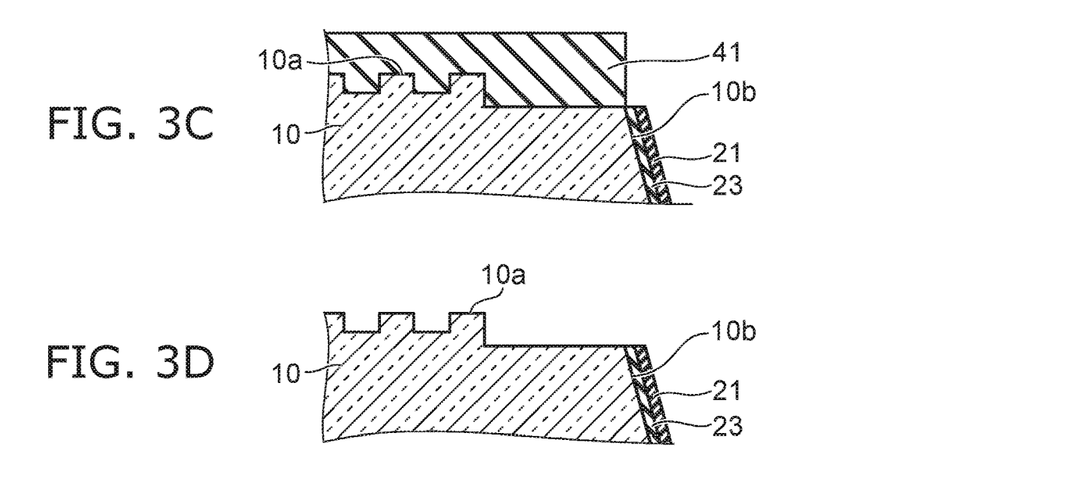

As shown in FIG. 3C, a film that is used to form the intermediate film 23 is formed on the second surface 10b; and a film that is used to form the first film 21 also is formed. The film that is used to form the intermediate film 23 is, for example, an amorphous silicon film. For example, sputtering, vacuum vapor deposition, or the like is used to form the film used to form the intermediate film 23. The film that is used to form the first film 21 is, for example, an amorphous aluminum oxide film. For example, sputtering, vacuum vapor deposition, atomic layer deposition (ALD), or the like is used to form the film used to form the first film 21. The thickness of the film used to form the intermediate film 23 is, for example, not less than 10 nm and not more than 100 nm. The thickness of the film used to form the first film 21 is, for example, not less than 20 nm and not more than 50 nm.

As shown in FIG. 3D, the mask 41 is removed; and heating is performed. The temperature of the heating is, for example, 800° C. or more. Thereby, the intermediate film 23 and the first film 21 are obtained. At least a portion of the intermediate film 23 may include crystallized silicon. At least a portion of the first film 21 may include crystallized aluminum oxide.

Figure 3E:
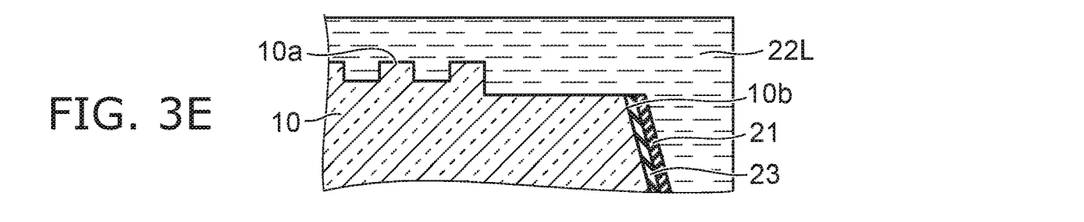

As shown in FIG. 3E, a liquid 22L that includes phosphonic acid including fluoroalkyl is caused to contact the first film 21. For example, the base body 10 on which the intermediate film 23 and the first film 21 are provided is immersed in the liquid 22L. The phosphonic acid selectively adheres to the aluminum oxide (the first film 21). The phosphonic acid does not adhere to the silicon oxide (the first surface 10a).

Figure 3F:
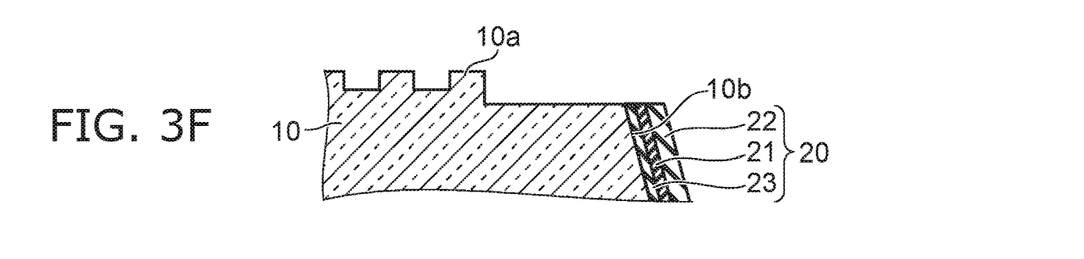

Heating is performed as shown in FIG. 3F. The temperature of the heating is, for example, not less than 120° C. and not more than 160° C. (e.g., about 140° C.). Thereby, the bond between the phosphonic acid and the aluminum included in the first film 21 is stabilized. For example, a bond including a phosphate bond is formed.

Thus, the template 110 can be manufactured.

In the pattern formation method that uses the template 110, there are cases where characteristics of the second film 22 degrade, etc. For example, there are cases where the adhesion of dirt or foreign matter, peeling of a portion of the second film 22, etc., occur. In such a case, the second film 22 may be removed; and the second film 22 may be newly formed. For example, in the pattern formation method, the following processes may be performed after the process described in reference to FIG. 2B.

Figure 4A:
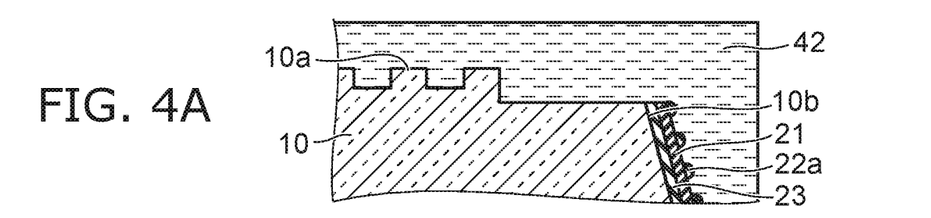
FIG. 4A to FIG. 4C are schematic cross-sectional views illustrating the pattern formation method according to the embodiment.
Figure 4B:
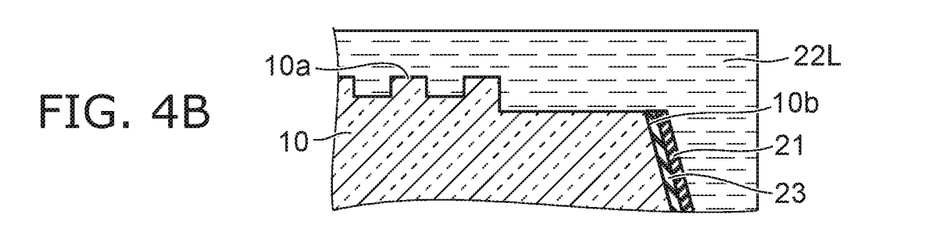
Figure 4C:
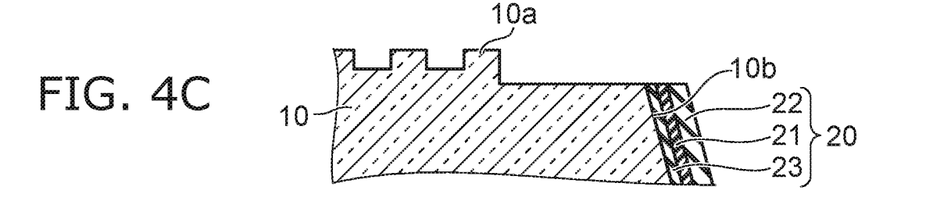

FIG. 4A to FIG. 4C are schematic cross-sectional views illustrating the pattern formation method according to the embodiment.

As shown in FIG. 4A, for example, in the pattern formation method, the second film 22 is caused to contact a solution 42 (e.g., a piranha solution including sulfuric acid and hydrogen peroxide) after the process described in reference to FIG. 2B. For example, the base body 10 on which the second film 22 is provided is immersed in the solution 42. Thereby, the second film 22 is removed. An intermediate state of the removal of the second film 22 is drawn in FIG. 4A; and a portion 22a of the second film 22 exists. Subsequently, the second film 22 is removed.

Thus, the removal of at least a portion of the second film 22 includes, for example, causing the second film 22 to contact a liquid including sulfuric acid and hydrogen peroxide. The removal of the at least a portion of the second film 22 may include irradiating, on the second film 22, a second electromagnetic wave of a wavelength of 300 nm or less. The second electromagnetic wave is irradiated from the second film 22 side toward the first film 21. At least a portion of the second film 22 is removed by the second electromagnetic wave decomposing the at least a portion of the second film 22.

The intermediate film 23 and the first film 21 remain in this process. At least a portion of the intermediate film 23 is crystallized by the heat treatment described in reference to FIG. 3D. At least a portion of the first film 21 is crystallized. Thereby, the intermediate film 23 and the first film 21 remain. In the description recited above, the removal of organic substances is performed using sulfuric acid and hydrogen peroxide. In the embodiment, the removal of the organic substances may be performed by a method including at least one of ozone treatment, ultraviolet light irradiation, or oxygen plasma processing.

Subsequently, for example, cleaning by ultraviolet irradiation may be performed after rinsing.

As shown in FIG. 4B, the liquid 22L including phosphonic acid including fluoroalkyl is caused to contact the first film 21. Thereby, a film that is used to form the second film 22 is formed selectively on the first film 21.

Heat treatment (e.g., about 140° C.) is performed as shown in FIG. 4C. Thereby, a new second film 22 is formed. The bond between the phosphonic acid and the aluminum included in the first film 21 stabilizes. For example, a bond that includes a phosphate bond is formed.

Thus, in the pattern formation method according to the embodiment, at least a portion of the second film 22 may be removed after the solidification of the resin liquid 30. Then, a new second film 22 may be formed by causing a material including a phosphonic acid including fluoroalkyl to contact the surface of the first film 21. The second film 22 is renewable.

By using the template on which the new second film 22 is formed, the other resin liquid 30 may be caused to contact the unevenness 10pd; and the other resin liquid 30 may be caused to solidify by irradiating the first electromagnetic wave 45 on the other resin liquid 30 via the base body 10.

The embodiments may include the following configurations (e.g., technological proposals).

Configuration 1

A template, comprising:
a base body having a first surface and a second surface, the first surface including silicon oxide and spreading along a first plane, the second surface crossing the first plane; and
a first film including aluminum oxide,
a direction from the second surface toward the first film being aligned with a direction perpendicular to the second surface,
a thickness of the first film along the direction perpendicular to the second surface being not less than 0.3 nm and not more than 10 μm,
the first surface including an unevenness.

Configuration 2

The template according to Configuration 1, further comprising an intermediate film including silicon,
the intermediate film being positioned between the second surface and the first film,
a thickness of the intermediate film along the direction perpendicular to the second surface being not less than 10 nm and not more than 100 nm.

Configuration 3

The template according to Configuration 1 or 2, further comprising a second film including at least one of a phosphonic acid or a phosphonic acid compound, the phosphonic acid including fluoroalkyl, the phosphonic acid compound including fluoroalkyl,
the first film being positioned between the second film and the second surface.

Configuration 4

The template according to any one of Configurations 1 to 3, wherein at least a portion of the first film includes a crystal.

Configuration 5

A method for manufacturing a template, comprising:
preparing a base body having a first surface and a second surface, the first surface including silicon oxide and spreading along a first plane, the second surface crossing the first plane; and
forming a first film and a second film, the first film including aluminum oxide, the second film including at least one of a phosphonic acid or a phosphonic acid compound, the phosphonic acid including fluoroalkyl, the phosphonic acid compound including fluoroalkyl, the first film being positioned between the second surface and the second film.

Configuration 6

The method for manufacturing the template according to Configuration 5, wherein after the forming of the first film, heating is performed, and at least a portion of the first film includes a crystal.

Configuration 7

The method for manufacturing the template according to Configuration 6, wherein after the heating, at least a portion of a surface of the first film and at least a portion of the phosphonic acid including the fluoroalkyl are caused to bond by causing a material including the phosphonic acid including the fluoroalkyl to contact the surface, and by heating after the contacting.

Configuration 8

A pattern formation method, comprising:
preparing a template, the template including a base body, a first film, and a second film, the base body having a first surface and a second surface, the first surface including silicon oxide and spreading along a first plane and including an unevenness, the second surface crossing the first plane, the first film including aluminum oxide, the second film including at least one of a phosphonic acid or a phosphonic acid compound, the phosphonic acid including fluoroalkyl, the phosphonic acid compound including fluoroalkyl, the first film being positioned between the second film and the second surface; and
causing a resin liquid to contact the unevenness, and causing the resin liquid to solidify by irradiating a first electromagnetic wave on the resin liquid via the base body.

Configuration 9

The pattern formation method according to Configuration 8, wherein
the template further includes an intermediate film including silicon, and
the intermediate film is provided between the second surface and the first film.

Configuration 10

The pattern formation method according to Configuration 9, wherein a thickness of the intermediate film along a direction perpendicular to the second surface is not less than 10 nm and not more than 100 nm.

Configuration 11

The pattern formation method according to Configuration 9 or 10, wherein a peak wavelength of the first electromagnetic wave is 350 nm or more.

Configuration 12

The pattern formation method according to any one of Configurations 9 to 11, wherein a transmittance of the intermediate film is 1% or less for an electromagnetic wave of a wavelength of 300 nm or less.

Configuration 13

The pattern formation method according to Configuration 10, wherein a thickness of the first film along the direction perpendicular to the second surface is not less than 0.3 nm and not more than 10 μm.

Configuration 14

The pattern formation method according to any one of Configurations 8 to 13, wherein at least a portion of the first film includes a crystal.

Configuration 15

The pattern formation method according to any one of Configurations 8 to 14, further comprising:

removing at least a portion of the second film after the solidifying of the resin liquid; and forming a new second film by causing a material including the phosphonic acid including the fluoroalkyl to contact a surface of the first film.

Configuration 16

The pattern formation method according to Configuration 15, wherein the template having the new second film formed on the template is used to cause another resin liquid to contact the unevenness, and cause the other resin liquid to solidify by irradiating the first electromagnetic wave on the other resin liquid via the base body.

Configuration 17

The pattern formation method according to Configuration 15 or 16, wherein the removing of the at least a portion of the second film includes causing the second film to contact a liquid including sulfuric acid and hydrogen peroxide.

Configuration 18

The pattern formation method according to Configuration 15 or 16, wherein the removing of the at least a portion of the second film includes irradiating, on the second film, a second electromagnetic wave of a wavelength of 300 nm or less.

Configuration 19

The pattern formation method according to any one of Configurations 8 to 18, wherein the second film repels the resin liquid when the resin liquid is caused to contact the unevenness.

According to the embodiments, a template, a method for manufacturing the template, and a pattern formation method can be provided for which it is possible to improve the productivity.

Hereinabove, embodiments of the invention are described with reference to specific examples. However, the invention is not limited to these specific examples. For example, one skilled in the art may similarly practice the invention by appropriately selecting specific configurations of components included in the template such as the base body, the intermediate film, the first film, the second film, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All templates, methods for manufacturing templates, and pattern formation methods practicable by an appropriate design modification by one skilled in the art based on the template, the method for manufacturing the template, and the pattern formation method described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a template, comprising:

preparing a base body having a first surface and a second surface, the first surface including silicon oxide and spreading along a first plane, the second surface crossing the first plane;

forming an intermediate film on the second surface of the base body, the intermediate film including silicon as a main component;

forming a first film on the intermediate film, the first film including aluminum oxide; and forming a second film on the first film, the second film including at least one of a phosphonic acid or a phosphonic acid compound, the phosphonic acid including fluoroalkyl, the phosphonic acid compound including fluoroalkyl.

2. The method according to claim 1, wherein after the forming of the first film, heating is performed, and at least a portion of the first film includes a crystal.

3. The method according to claim 2, wherein after the heating, at least a portion of a surface of the first film and at least a portion of the phosphonic acid including the fluoroalkyl are caused to bond by causing a material including the phosphonic acid including the fluoroalkyl to contact the surface, and by heating after the contacting.

4. The method according to claim 1, wherein aluminum included in the aluminum oxide is bonded with the at least one of the phosphonic acid or the phosphonic acid compound.

5. The method according to claim 1, wherein aluminum included in the aluminum oxide is bonded with the at least one of the phosphonic acid or the phosphonic acid compound to form a monolayer film.

6. The method according to claim 1, wherein the silicon is at least one of crystalline silicon, polycrystalline silicon, microcrystalline silicon and amorphous silicon.

7. The method according to claim 1, wherein the intermediate film physically contacts the aluminum oxide.

8. The method according to claim 1, wherein the forming the second film includes a treatment using a liquid of the at least one of a phosphonic acid or a phosphonic acid compound.

9. The method according to claim 1, wherein the intermediate film is made of silicon.

10. The method according to claim 1, wherein a thickness of the intermediate film is not more than 100 nm.

11. The method according to claim 1, wherein
the forming the first film is performed after the forming the intermediate film,
heating the intermediate film and the first film is performed after the forming the first film and after the forming the intermediate film, and
the first film is caused to contact a liquid comprising a phosphonic acid including fluoroalkyl after the heating.

* * * * *